United States Patent [19]

Gordon

[11] Patent Number: 5,038,243
[45] Date of Patent: Aug. 6, 1991

[54] LOCAL INITIALIZATION FOR INCREMENTAL ENCODER

[75] Inventor: Gary B. Gordon, Saratoga, Calif.

[73] Assignee: Hewlett-Packard Company, Palo Alto, Calif.

[21] Appl. No.: 382,824

[22] Filed: Jul. 19, 1989

[51] Int. Cl.⁵ .......................................... H03M 1/22
[52] U.S. Cl. ......................................... 341/2; 341/11; 250/231.13; 324/173; 324/174; 324/175
[58] Field of Search ................. 341/11, 2; 250/231.13; 324/173–175

[56] References Cited

U.S. PATENT DOCUMENTS

| | | | |
|---|---|---|---|
| 3,213,443 | 10/1965 | Lancaster et al. | 340/347 |
| 3,500,449 | 3/1970 | Lenz | 250/214 |
| 3,525,094 | 8/1970 | Leonard | 250/231 |
| 3,732,557 | 5/1973 | Evans et al. | 340/324 |
| 3,968,570 | 7/1976 | Leuchter, Jr. et al. | 33/267 |
| 4,041,483 | 8/1977 | Groff | 340/347 |
| 4,074,798 | 2/1978 | Berger | 197/53 |
| 4,162,124 | 7/1979 | Feldman et al. | 356/4 |
| 4,183,014 | 1/1980 | McClean et al. | 340/204 |
| 4,358,753 | 11/1982 | Cascini | 340/347 |
| 4,363,026 | 11/1982 | Salmon | 340/347 |
| 4,533,902 | 8/1985 | Baker et al. | 340/347 |
| 4,740,690 | 4/1988 | Mosier | 341/2 |

OTHER PUBLICATIONS

Wolf et al., "Absolute Encoders Find Increased Application" I&CS, Feb., 1989, pp. 67–69.

Primary Examiner—Benjamin R. Fuller
Assistant Examiner—Nancy Le

[57] ABSTRACT

A position encoder for monitoring the position of a robot arm includes an incremental encoder section which can be initialized locally by an initialization section. The initialization section comprises three engaged encoder gears with relative prime number of teeth, e.g., 23, 24 and 25, so that respective index apertures of the gears precess with successive revolutions of the gears. Upon startup, the robot arm can be moved sufficiently for all three apertures to be detected so that their relative phase positions can be determined. The relative phases can be used to determine an absolute initialization position. Once this initialization position is determined, robot motions can be tracked using the incremental encoder section.

7 Claims, 8 Drawing Sheets

| N1 | N2 | N2' | REV# | N1 | N2 | N2' | REV# | N1 | N2 | N2' | REV# | N1 | N2 | N2' | REV# |
|---|---|---|---|---|---|---|---|---|---|---|---|---|---|---|---|
| 0 | 0 | 0 | 0 | 2 | 0 | 0 | 50 | 6 | 0 | 0 | 150 | 22 | 0 | 0 | 550 |
| 1 | 2 | 2 | 1 | 3 | 2 | 2 | 51 | 7 | 2 | 2 | 151 | 23 | 2 | 2 | 551 |
| 2 | 4 | 4 | 2 | 4 | 4 | 4 | 52 | 8 | 4 | 4 | 152 | 0 | 4 | 4 | 552 |
| 3 | 6 | 6 | 3 | 5 | 6 | 6 | 53 | 9 | 6 | 6 | 153 | 1 | 6 | 6 | 553 |
| 4 | 8 | 8 | 4 | 6 | 8 | 8 | 54 | 10 | 8 | 8 | 154 | 2 | 8 | 8 | 554 |
| 5 | 10 | 10 | 5 | 7 | 10 | 10 | 55 | 11 | 10 | 10 | 155 | 3 | 10 | 10 | 555 |
| 6 | 12 | 12 | 6 | 8 | 12 | 12 | 56 | 12 | 12 | 12 | 156 | 4 | 12 | 12 | 556 |
| 7 | 14 | 14 | 7 | 9 | 14 | 14 | 57 | 13 | 14 | 14 | 157 | 5 | 14 | 14 | 557 |
| 8 | 16 | 16 | 8 | 10 | 16 | 16 | 58 | 14 | 16 | 16 | 158 | 6 | 16 | 16 | 558 |
| 9 | 18 | 18 | 9 | 11 | 18 | 18 | 59 | 15 | 18 | 18 | 159 | 7 | 18 | 18 | 559 |
| 10 | 20 | 20 | 10 | 12 | 20 | 20 | 60 | 16 | 20 | 20 | 160 | 8 | 20 | 20 | 560 |
| 11 | 22 | 22 | 11 | 13 | 22 | 22 | 61 | 17 | 22 | 22 | 161 | 9 | 22 | 22 | 561 |
| 12 | 24 | 24 | 12 | 14 | 24 | 24 | 62 | 18 | 24 | 24 | 162 | 10 | 24 | 24 | 562 |
| 13 | 1 | 26 | 13 | 15 | 1 | 26 | 63 | 19 | 1 | 26 | 163 | 11 | 1 | 26 | 563 |
| 14 | 3 | 28 | 14 | 16 | 3 | 28 | 64 | 20 | 3 | 28 | 164 | 12 | 3 | 28 | 564 |
| 15 | 5 | 30 | 15 | 17 | 5 | 30 | 65 | 21 | 5 | 30 | 165 | 13 | 5 | 30 | 565 |
| 16 | 7 | 32 | 16 | 18 | 7 | 32 | 66 | 22 | 7 | 32 | 166 | 14 | 7 | 32 | 566 |
| 17 | 9 | 34 | 17 | 19 | 9 | 34 | 67 | 23 | 9 | 34 | 167 | 15 | 9 | 34 | 567 |
| 18 | 11 | 36 | 18 | 20 | 11 | 36 | 68 | 0 | 11 | 36 | 168 | 16 | 11 | 36 | 568 |
| 19 | 13 | 38 | 19 | 21 | 13 | 38 | 69 | 1 | 13 | 38 | 169 | 17 | 13 | 38 | 569 |
| 20 | 15 | 40 | 20 | 22 | 15 | 40 | 70 | 2 | 15 | 40 | 170 | 18 | 15 | 40 | 570 |
| 21 | 17 | 42 | 21 | 23 | 17 | 42 | 71 | 3 | 17 | 42 | 171 | 19 | 17 | 42 | 571 |
| 22 | 19 | 44 | 22 | 0 | 19 | 44 | 72 | 4 | 19 | 44 | 172 | 20 | 19 | 44 | 572 |
| 23 | 21 | 46 | 23 | 1 | 21 | 46 | 73 | 5 | 21 | 46 | 173 | 21 | 21 | 46 | 573 |
| 0 | 23 | 48 | 24 | 2 | 23 | 48 | 74 | 6 | 23 | 48 | 174 | 22 | 23 | 48 | 574 |
| 1 | 0 | 0 | 25 | 3 | 0 | 0 | 75 | 7 | 0 | 0 | 175 | 23 | 0 | 0 | 575 |
| 2 | 2 | 2 | 26 | 4 | 2 | 2 | 76 | 8 | 2 | 2 | 176 | 0 | 2 | 2 | 576 |
| 3 | 4 | 4 | 27 | 5 | 4 | 4 | 77 | 9 | 4 | 4 | 177 | 1 | 4 | 4 | 577 |
| 4 | 6 | 6 | 28 | 6 | 6 | 6 | 78 | 10 | 6 | 6 | 178 | 2 | 6 | 6 | 578 |
| 5 | 8 | 8 | 29 | 7 | 8 | 8 | 79 | 11 | 8 | 8 | 179 | 3 | 8 | 8 | 579 |
| 6 | 10 | 10 | 30 | 8 | 10 | 10 | 80 | 12 | 10 | 10 | 180 | 4 | 10 | 10 | 580 |
| 7 | 12 | 12 | 31 | 9 | 12 | 12 | 81 | 13 | 12 | 12 | 181 | 5 | 12 | 12 | 581 |
| 8 | 14 | 14 | 32 | 10 | 14 | 14 | 82 | 14 | 14 | 14 | 182 | 6 | 14 | 14 | 582 |
| 9 | 16 | 16 | 33 | 11 | 16 | 16 | 83 | 15 | 16 | 16 | 183 | 7 | 16 | 16 | 583 |
| 10 | 18 | 18 | 34 | 12 | 18 | 18 | 84 | 16 | 18 | 18 | 184 | 8 | 18 | 18 | 584 |
| 11 | 20 | 20 | 35 | 13 | 20 | 20 | 85 | 17 | 20 | 20 | 185 | 9 | 20 | 20 | 585 |
| 12 | 22 | 22 | 36 | 14 | 22 | 22 | 86 | 18 | 22 | 22 | 186 | 10 | 22 | 22 | 586 |
| 13 | 24 | 24 | 37 | 15 | 24 | 24 | 87 | 19 | 24 | 24 | 187 | 11 | 24 | 24 | 587 |
| 14 | 1 | 26 | 38 | 16 | 1 | 26 | 88 | 20 | 1 | 26 | 188 | 12 | 1 | 26 | 588 |
| 15 | 3 | 28 | 39 | 17 | 3 | 28 | 89 | 21 | 3 | 28 | 189 | 13 | 3 | 28 | 589 |
| 16 | 5 | 30 | 40 | 18 | 5 | 30 | 90 | 22 | 5 | 30 | 190 | 14 | 5 | 30 | 590 |
| 17 | 7 | 32 | 41 | 19 | 7 | 32 | 91 | 23 | 7 | 32 | 191 | 15 | 7 | 32 | 591 |
| 18 | 9 | 34 | 42 | 20 | 9 | 34 | 92 | 0 | 9 | 34 | 192 | 16 | 9 | 34 | 592 |
| 19 | 11 | 36 | 43 | 21 | 11 | 36 | 93 | 1 | 11 | 36 | 193 | 17 | 11 | 36 | 593 |
| 20 | 13 | 38 | 44 | 22 | 13 | 38 | 94 | 2 | 13 | 38 | 194 | 18 | 13 | 38 | 594 |
| 21 | 15 | 40 | 45 | 23 | 15 | 40 | 95 | 3 | 15 | 40 | 195 | 19 | 15 | 40 | 595 |
| 22 | 17 | 42 | 46 | 0 | 17 | 42 | 96 | 4 | 17 | 42 | 196 | 20 | 17 | 42 | 596 |
| 23 | 19 | 44 | 47 | 1 | 19 | 44 | 97 | 5 | 19 | 44 | 197 | 21 | 19 | 44 | 597 |
| 0 | 21 | 46 | 48 | 2 | 21 | 46 | 98 | 6 | 21 | 46 | 198 | 22 | 21 | 46 | 598 |
| 1 | 23 | 48 | 49 | 3 | 23 | 48 | 99 | 7 | 23 | 48 | 199 | 23 | 23 | 48 | 599 |
|  |  |  |  |  |  |  |  |  |  |  |  | 0 | 0 | 0 | 600 |

LOCAL INITIALIZATION FOR INCREMENTAL ENCODER

BACKGROUND OF THE INVENTION

The present invention relates to position encoders and, more particularly, to position encoders used to track position in robotic systems and the like. A major objective of the present invention is to provide an improved incremental position encoder which provides for local initialization.

Robots and robotic systems are becoming increasingly important in a wide variety of fields, being well suited for tasks requiring many repetitions, high-precision, and/or other capabilities, as well as providing for performance in hazardous environments. Robot joints and other positioning servomechanisms require position encoders so that a present position can be compared with a target position to determine the change of position required for a particular operation.

Position encoders can be classified as incremental, absolute and quasi-absolute. Typically, an incremental encoder includes a wheel with tally marks arranged in a circular array about the wheel. A sensor detects the passage of tally marks as the orientation of the wheel is changed. Generally, two sensors are arranged in quadrature so that the direction as well as the magnitude of the orientation change can be determined. The direction determination can be used to select the sign of a bidirectional counter which tracks motion as a function of the passage of tally marks.

An incremental encoder must be initialized relative to an origin to provide information as to absolute position. A method used in some plotters and printers is to slowly traverse the mechanism to one end and trip a microswitch or opto-sensor. However, in many robotics a return to an origin can be unaesthetic, wasteful, and even dangerous since the position of the joint being initialized may be unknown. This is especially true for multi-axis robots where the position of one joint is dependent on the, also unknown, positions of other joints.

Absolute position encoders provide a readout of absolute position, thereby avoiding the problem with initialization movements that plagues incremental encoders. Gray encoders provide absolute position reading using multiple tracks of marks and a respective sensor for each track. The marks are designed so that each absolute position is represented by a unique combination of sensor outputs. The number of absolute positions that can be differentiated is limited to $2^n$, where n is the number of tracks. A typical 10-sensor Gray encoder can distinguish 1024 positions. A larger number of positions can be distinguished by using more tracks and sensors. However, the increased number of tracks adds to the manufacturing precision of the encoder since all of the tracks must align with each other, thus making the encoder uneconomical. The large number of sensors required also increases the cost of Gray encoders.

Quasi-absolute encoders require fewer sensors and tracks to provide equivalent position differentiations at the expense of requiring up to one revolution of motion for initialization. In effect, a quasi-absolute encoder distinguishes a certain number of absolute positions and provides additional resolution by interpolating between these positions in a manner similar to an incremental encoder. For example, U.S. Pat. No. 4,041,483 to Groff discloses a quasi-absolute "Groff" encoder which uses six sensors to read two gears, each with two tracks to distinguish 1024 positions. One track of each gear includes an index mark subtending a predetermined angle to indicate the orientation of that gear. The other track of each gear provides incremental interpolation of position for that gear. The gears have different numbers of teeth so that the index marks process relative to each other during successive revolutions. The spatial phase angle between index marks provides a gross representation of absolute position. Distance from one of the (32) absolute positions is measured incrementally by counting (up to 32) tally marks.

The primary disadvantages of the absolute and quasi-absolute encoders is the limitated number of states that can be distinguished. An incremental encoder can distinguish as many states as can be counted by the incorporated counter using a pair of sensors and a single wheel. The encoder wheel can turn as many times as required to cover a full range of motion. With proper gearing, any level of precision can be accommodated.

Theoretically, absolute and quasi-absolute encoders can be scaled and/or used in tandem to distinguish any number of states. However, the bulk, complexity and cost of providing an absolute encoder which distinguishes 1,000,000 states preclude its use in many applications. A comparable limitation applies to the quasi-absolute encoders even though fewer sensors and tracks are required. For example, the Groff encoder requires marks which subtend very precisely defined angles. Providing a Groff encoder which could distinguish 1,000,000 positions by increasing the differentiation provided by the incremental tracks would require very strict manufacturing tolerances to be met. These strict manufacturing tolerances would require high costs and quality control problems. The complexity of the logic and track patterning required for a 1,000,000+ state Groff encoder could present significant design challenges.

What is needed is a position encoder which combines the range and precision available using incremental encoders with the convenience of absolute and quasi-absolute encoders. In other words, an encoder is needed which avoids the bulk, expense and complexity of absolute encoders, and also avoids the need for a blind return to an initialization position required of incremental encoders. Preferably, these needs are met in a system which utilizes relative few sensors and requires only moderate manufacturing tolerances.

SUMMARY OF THE INVENTION

In accordance with the present invention, a hybrid position encoder provides for local initialization followed by incremental position tracking. Incremental position tracking is provided by an incremental encoder including a wheel with a closed array of tally marks and at least one sensor for detecting the passage of these tally marks as the orientation of the wheel changes. Absolute position determination is effected by using the tally marks to measure the phase angle between index marks on two or more gears, or other rotational elements.

Preferably, an absolute position determination is made initially by detecting index marks during a single rotation in which the gear with the greatest number of teeth makes at most one revolution. Once all index marks have been detected, the gears can be realigned to a reference position which is then used as the local initialization position from which incremental position tracking can proceed. Alternatively, this realignment step can be dispensed with and an offset from such a reference can be used as an initial count for the incremental position tracking.

The incremental encoder section can be conventional. For example, its wheel can be a disk attached to the shaft of a motor. The tally marks can be alternating radial strips arranged in a circular array near the rim of the disk. Two sensors arranged in quadrature relationship to each other can detect passing tally marks to determine the direction and degree of any orientation change. Since the incremental encoder section can be conventional, in one of its aspects, the present invention provides an absolute encoder section which provides for local initialization of an incremental encoder section.

The absolute encoder section can utilize two or more, and preferably three, interlocking gears, each with an aperture mark. A respective sensor for each gear can be used to detect when the aperture mark is aligned with the sensor and thus when that gear is in the corresponding orientation. The gears have different, and preferably relatively prime, numbers of teeth so that their index marks process relative to each other. The gears are mechanically coupled to the incremental encoder wheel and to the motor shaft, or other object of interest, so that the object, wheel and gears rotate together, albeit at respective rates. The incremental encoder can thus be used to measure the phase angles between the index apertures, or other marks, of the gears. The phase angles can be used to identify an absolute position of the object of interest. The present invention thus provides a method of locally initializing an incremental encoder using the novel absolute encoder section.

The number of tally marks on the incremental encoder wheel must be at least twice the number of teeth on the gear, or other rotational assembly, with the greatest number of teeth. The factor of two is arrived at by analogy with information theory or sampling theory in which a Nyquist limit specifies that a sampling rate must be at least twice the highest frequency of a waveform being sampled to provide a viable representation of that waveform. In the context of the hybrid encoder, the incremental encoder samples each of the gear positions. To do this unambiguously, the Nyquist criterion must be met. In practice, the number of tally marks would greatly exceed the greatest number of teeth. This relationship not only minimizes the chances of ambiguous readings, but also extends the range and precision afforded by the hybrid encoder..

When the absolute encoder section uses three gears with, respectively, 23, 24 and 25 teeth, and an encoder wheel with 2048 tally marks, more than 1,000,000 positions can be distinguished. Initialization can be effected within one revolution of the most slowly rotating gear. Five sensors, two for the quadrature encoding of the incremental encoder wheel and one each for the absolute encoder gears are required. The apertures in the gears can be formed with relatively relaxed tolerances. Overall, the hybrid encoder provides a relatively compact, low-cost device with local initialization in combination with the other advantages of an incremental encoder. These and other features and advantages of the present invention are described below with reference to the following drawings.

DESCRIPTION OF THE PREFERRED EMBODIMENTS

Figure 1:
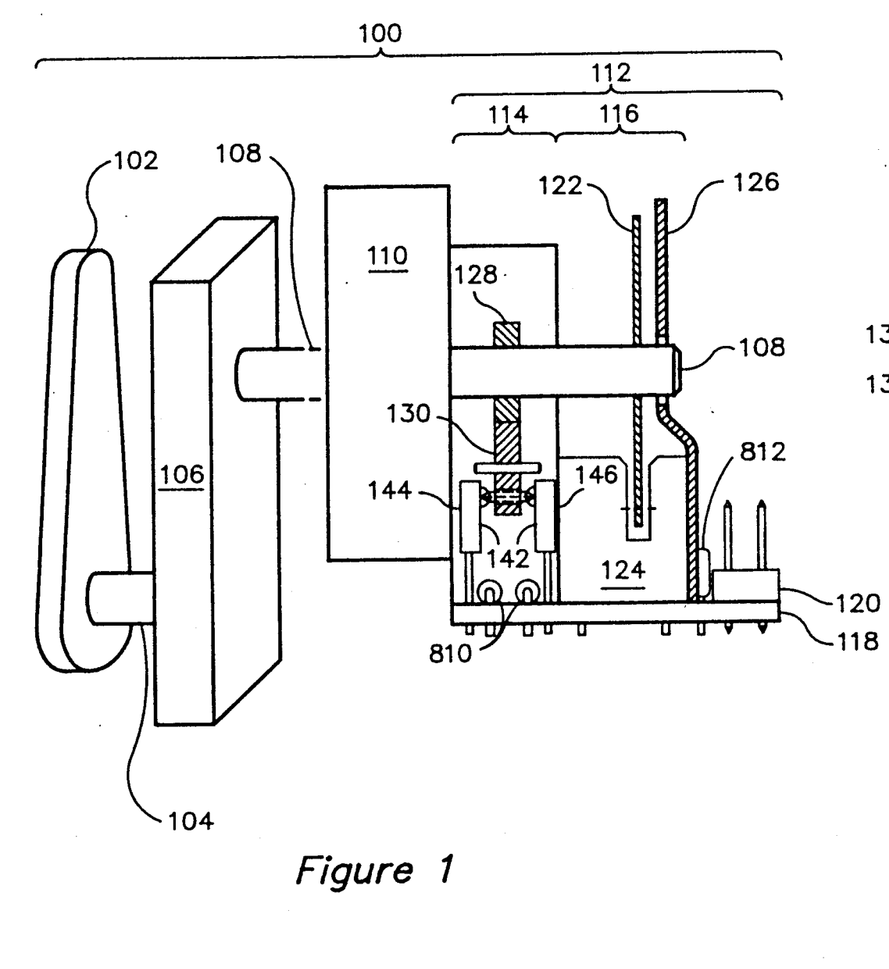
FIG. 1 is a schematic side view of a robot arm including a position encoder in accordance with the present invention.

A servoed mechanical system 100 includes a robot arm 102, a load shaft 104, reduction gearing 106, a motor shaft 108, a motor 110, and a position encoder 112. The purpose of position encoder 112 is to determine and track the position of robot arm 102, which is driven by motor 110. Motor 110 and motor shaft 108 must turn many times to move robot arm 102 through its range due to the effect of reduction gearing 106. Therefore, it is necessary to ascertain the revolution number as well as the motor shaft orientation to determine robot arm position. Herein, "rotational position" refers to the position of the motor shaft measured in degrees and can assume any real number value, including values in excess of 360°; "orientation" refers to rotational position within one revolution, i.e., rotational position modulo 360°. The rotational position in degrees of motor shaft 108 can be calculated as the sum of its current orientation and a revolution number times 360°.

Position encoder 112 includes an initialization section 114 and an incremental encoder section 116. Initialization section 114 can be used to determine an initial rotational position of motor shaft 108. Incremental encoder section 116 can then be used to track changes of rotational position in a conventional manner. Position encoder 112 further includes a circuit board 118 for electrically interfacing position encoder 112 to a motion control microcomputer via a connector 120. Incremental encoder section 116, which is a Hewlett-Packard model HEDS-9100 incremental encoder, comprises a code wheel 122, an incremental sensor module 124, a metal shield 126 which provides mechanical protection for code wheel 122. Module 124 includes a pair of sensors arranged in quadrature for detecting the passage of tally apertures 127 which are arranged in a circular array about code wheel 122, as indicated in FIG. 2.

Figure 2:
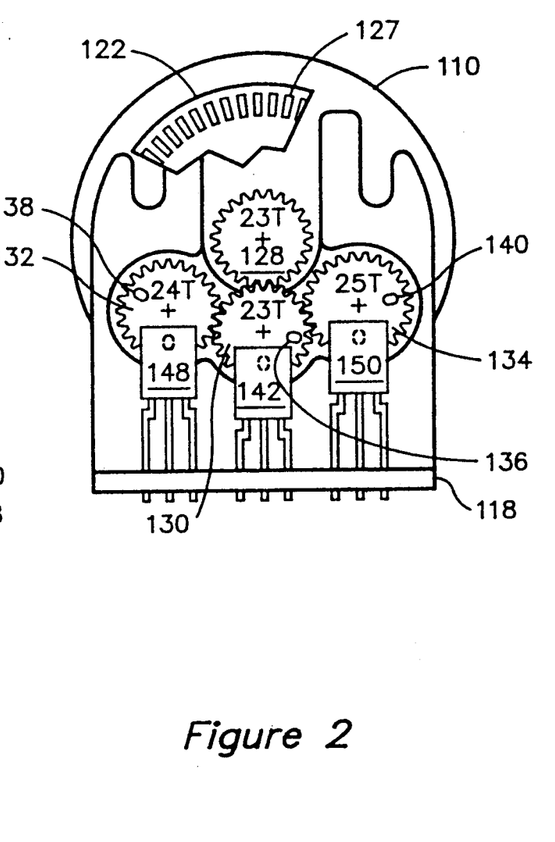
FIG. 2 is a schematic plan view of the encoder of FIG. 1.

Initialization section 114 comprises a drive gear 128, a first encoder gear 130, a second gear 132, and a third encoder gear 134, as shown in FIG. 2. Drive gear 128 has 23 teeth; encoder gear 130 has 23 teeth and a first index aperture 136; encoder gear 132 has 24 teeth and a second index aperture 138; and encoder gear 134 has 25 teeth and a third index aperture 140. Initialization section 114 further comprises a first index sensor 142 for detecting when first index aperture 136 is aligned therewith. As best seen in FIG. 1, sensor 142 includes an emitter 144 and a detector 146 on opposite sides of gear 130. Gear 130 blocks light emitted from emitter 144 until aperture 136 is in alignment so that the light can pass therethrough to be detected by detector 146. Similarly, a second index sensor 148 is used to detect alignment of aperture 138 of encoder gear 132, and a third index sensor 150 is used to alignment of aperture 140 of gear 134, as shown in FIG. 2.

Figure 3A:
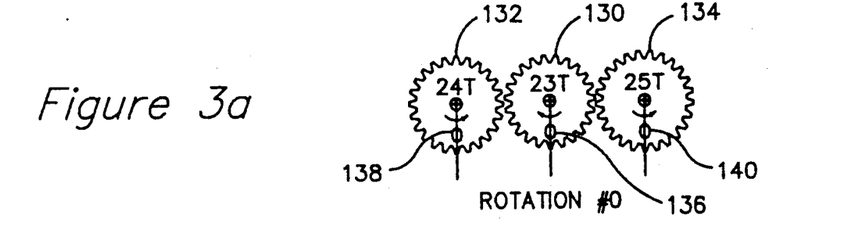
FIGS. 3A–3E show selective relative orientations of gears of the position encoder of FIG. 1.

FIGS. 3A-3E show five of the 600 possible alignments of encoder gears 130, 132 and 134 that can be resolved by the initialization section. In FIG. 3A, index apertures 136, 138 and 140 are concurrently aligned with respective sensors 142, 148 and 150. This is arbitrarily assigned to represent a zero point for measuring angular rotation for robot arm 102, motor shaft 108, wheel 122 and gears 128, 130, 132 and 134.

Figure 3B:
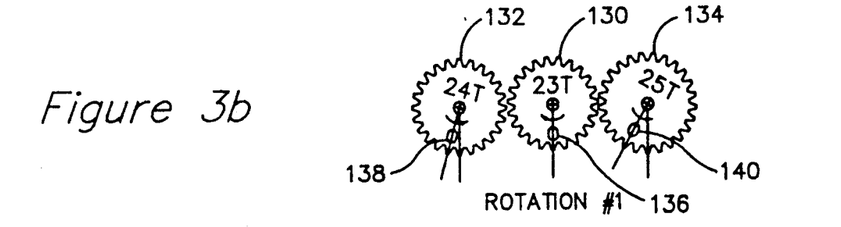

FIG. 3B represents the state of encoders gear 130, 132 and 134 after precisely one counterclockwise motor revolution, and therefore one revolution of code wheel 122, shaft 108 and drive gear 128. Since encoder gear 130 has the same number of teeth as drive gear 128, it has undergone exactly one clockwise revolution so that index aperture 136 is again aligned with sensor 142. However, because encoder gear 132 has one more tooth than gear 130, its lags gear 130 by one tooth after one revolution. Likewise, gear 134, which has two more teeth than gear 130, lags it by two teeth after one revolution.

Figure 3C:
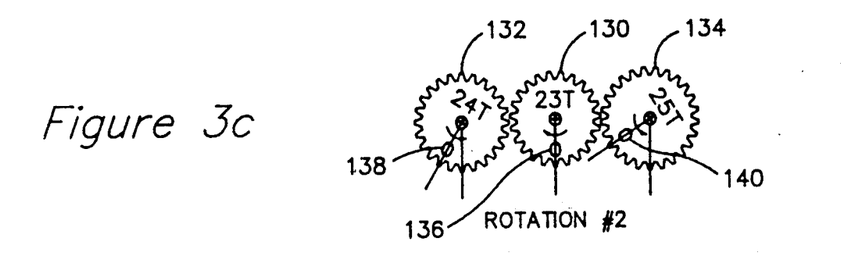

FIG. 3C represents the state of encoder gears 130, 132, and 134 after two complete counterclockwise motor revolutions. Again, gear 130 has returned to its alignment position. Gear 132 now lags it by two teeth and gear 134 now lags it by four teeth. By extrapolation, one can distinguish 24 revolution numbers by examining the extent which 24 tooth gear 132 lags 23 tooth gear 130 at any given time.

Figure 3D:
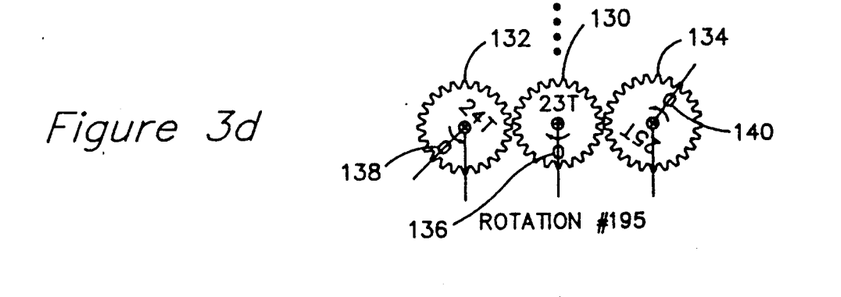

FIG. 3D represents the state of encoder gears 130, 132, and 134 after 195 counterclockwise motor revolutions. Gear 132 lags gears 130 by three teeth. Thus, examining only gears 130 and 132, it appear as if FIG. 3D. represents revolution number three. However, after three revolutions, gear 134 would lag gear 130 by six, whereas in FIG. 3D, gear 134 lags gear 130 by 15 teeth. In accordance with the algorithm described below, FIG. 3D uniquely represents revolution number 195 in a 600 revolution sequence.

Figure 3E:
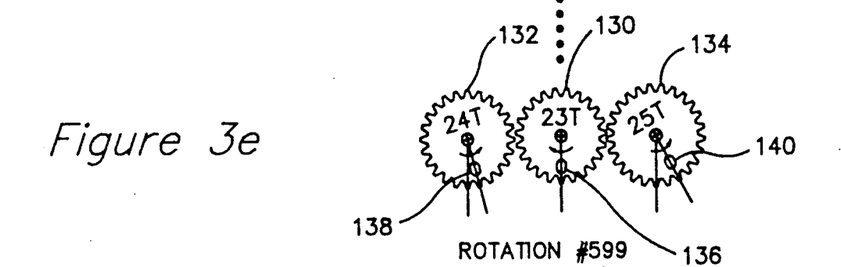

FIG. 3E represents the last encodable revolution number, i.e., revolution number 599. In FIG. 3E, gear 132 leads gear 130 by one tooth and gear 134 leads gear 130 by two teeth. It can be seen that after one more revolution, all three gears will be aligned and appear after their 600th revolution as they did at their initial position represented in FIG. 3A.

In general, an initial revolution number can be determined by comparing the spatial phases of index apertures 136, 138 and 140. Comparing spatial phases requires detection of each index aperture. Detection requires sufficient rotation so that each index aperture is detected by its respective sensor. Relative phases can then be measured by the number of tally aperture detections between index mark detections. The relative phases then be used to calculate an initial rotational position for robot arm 102. Subsequent movements of robot arm 102 can then be tracked by incremental encoder section 116.

Figure 4:
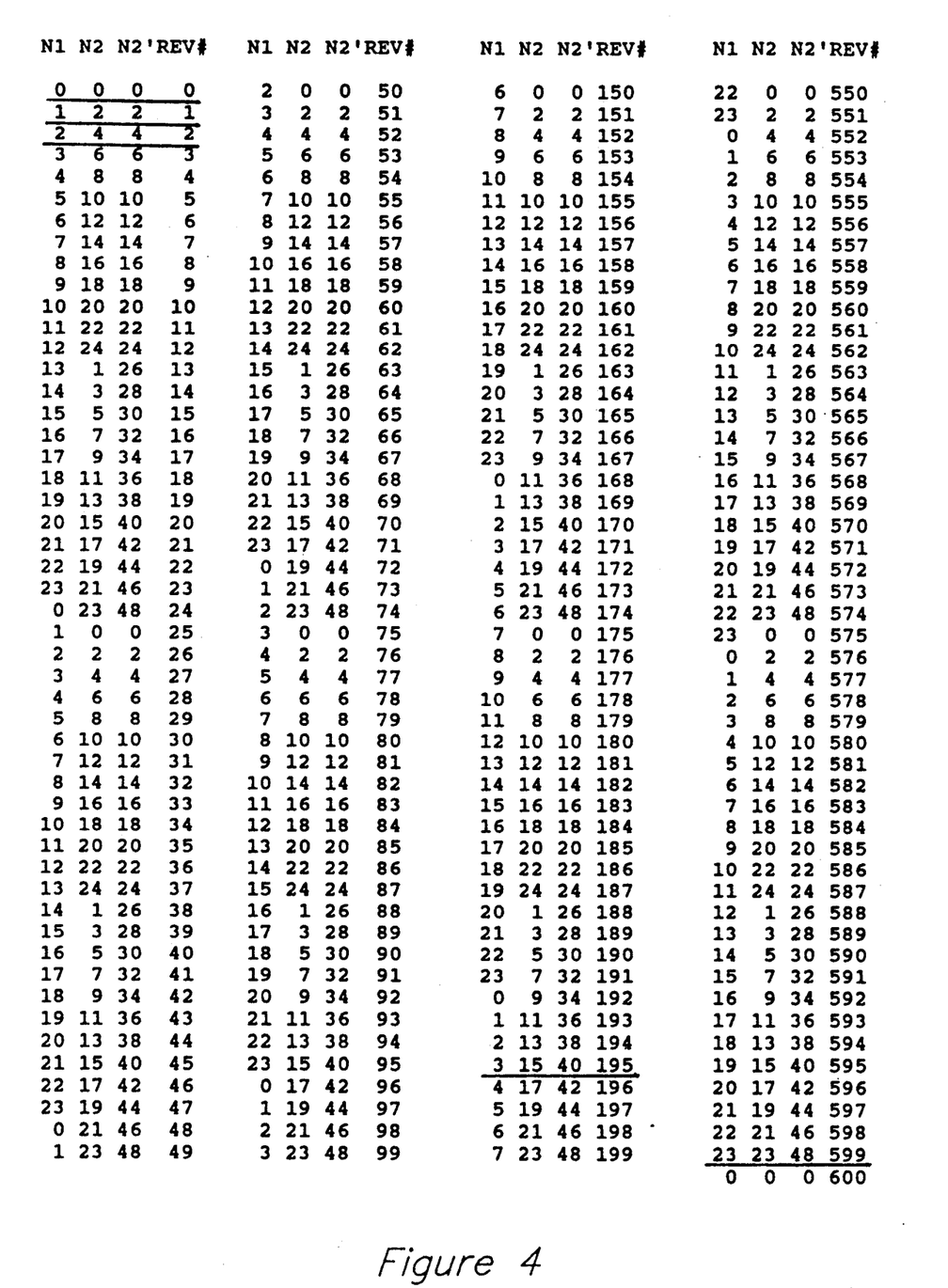
FIG. 4 is a table for position determinations effected using the position encoder of FIG. 1.

One way to decode the spatial phases so determined is to use a table such as that of FIG. 4, which can be coded in ROM and the phase determinations used as addresses. FIG. 4 shows the first 200 and last 50 decodings. The phases represented in FIGS. 3A-3E are underlined. For example, the first state in FIG. 4 corresponds to FIG. 3A. The table can be pre-generated in ascending order of N1 and N2. For compatibility with binary architectures, N1 and N2 may be treated as 5-bit binary numbers. The contents of each memory location addressed would contain the appropriate one of the 600 revolution number; thus requiring at least 10 bits, or two 8-bit bytes. The total memory requirement is seen to be a modest $(2^5)(2^5)(2)=2048$ bytes. An algorithm described below can be used to generate the table entries. In practice, it suffices to solve for the revolution number of interest in real time using the algorithm and without using the ROM table.

Figure 5:
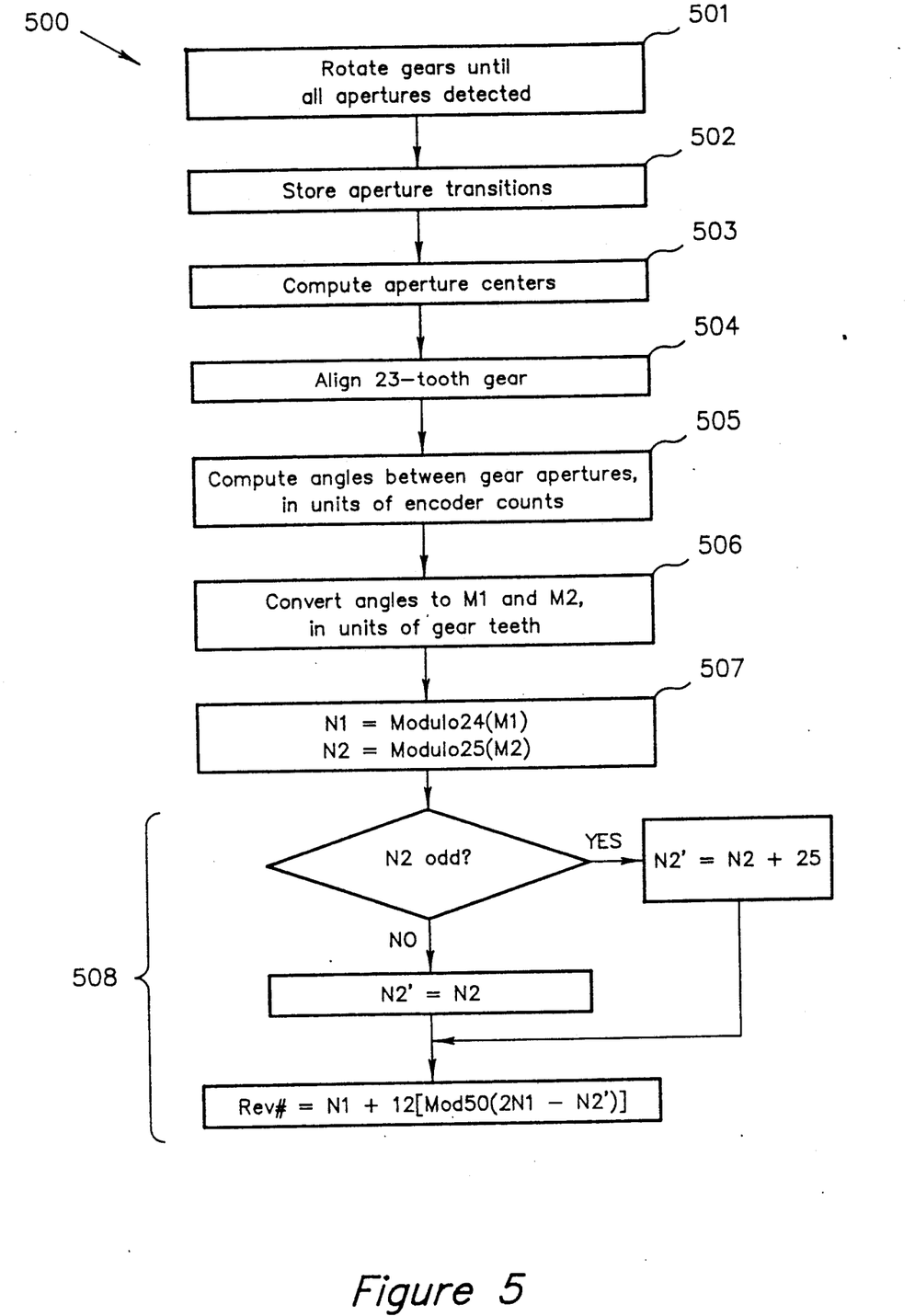
FIG. 5 is a flow chart of an algorithm applicable to deriving positional representations for the position encoder of FIG. 1.

In accordance with the present invention, a method 500 for initializing incremental encoder 116 is indicated by the flow chart of FIG. 5. In a first step 501, motor drives the gear assembly until all three index apertures are detected by their respective sensors. Rather than provide a single detection for each aperture, both the leading and trailing edges of the aperture are sensed, resulting in a total of six edge detections.

In step 502, tally counts are recorded for the edge transitions. Note that steps 501 and 502 overlap chronologically. In step 503, a center position for each aperture is computed by averaging the corresponding leading and trailing edge counts. In step 504, first encoder gear 130 is rotated to its computed center. This involves rotating the gears in reverse until the accumulated count equals the computed center for index aperture 136. This establishes an integral revolution number as an initialization position.

In step 505, the phase as measured in code wheel states between encoders gears 132 and 130 can be obtained by subtracting the center position value of gear 130 from that of gear 132. Likewise, the phase in code wheel states between encoder gears 134 and 130 can be obtained by subtracting the center position value of gear 130 from that of gear 134.

Code wheel 122 includes 512 index apertures which are read in quadrature by incremental encoder sensors within module 124. As is known in the art, 2048 quadrature states are derivable from the 512 index apertures. Thus, there are 2048/23, about 89.04, quadrature states per tooth of 23-tooth drive gear 128. Accordingly, advancing the motor shaft by about 89.04 quadrature states advances drive gear 128 by one tooth, and thus advances each encoder gear 130, 132, 134, by one tooth. In other words, for each encoder gear 130, 132, 134, there are about 89.04 quadrature states per tooth.

In step 506, the phase of encoder gear 132 relative to encoder 130 as measured in encoder gear quadrature states is multiplied by 23/2048 to provide a phase measurement in number of teeth. The resulting product is then rounded to the nearest integer M1 which can range form −23 to +23. In step 507, M1 is then expressed modulo-24, i.e., 24 is added to the product if it is negative. This modulo-24 integer is assigned to a variable N1. Similarly, in step 506, the phase of encoder gear 134 relative to encoder 130 as measured in encoder gear quadrature states is multiplied by 23/2048 to provide a phase measurement in number of teeth which is rounded to yield an integer M2 which can range from −24 to +24. In step 507, M2 is then expressed modulo-25, and the resulting modulo-25 integer is assigned to a variable N2. Values of variables N1 and N2 are represented in FIGS. 3A-3E for the encoder gear states represented therein.

In step 508, the revolution number R is determined according to the algorithm $$R = N1 + 12[\text{Mod}50(2N1 - N2')]$$

where $N2' = N2$ if N2 is even and $N2' = N2 + 25$ if N2 is odd. This computation can be made during initialization or precomputed for all 600 encoder gear states and stored in and accessed from a ROM table.

Figure 6:
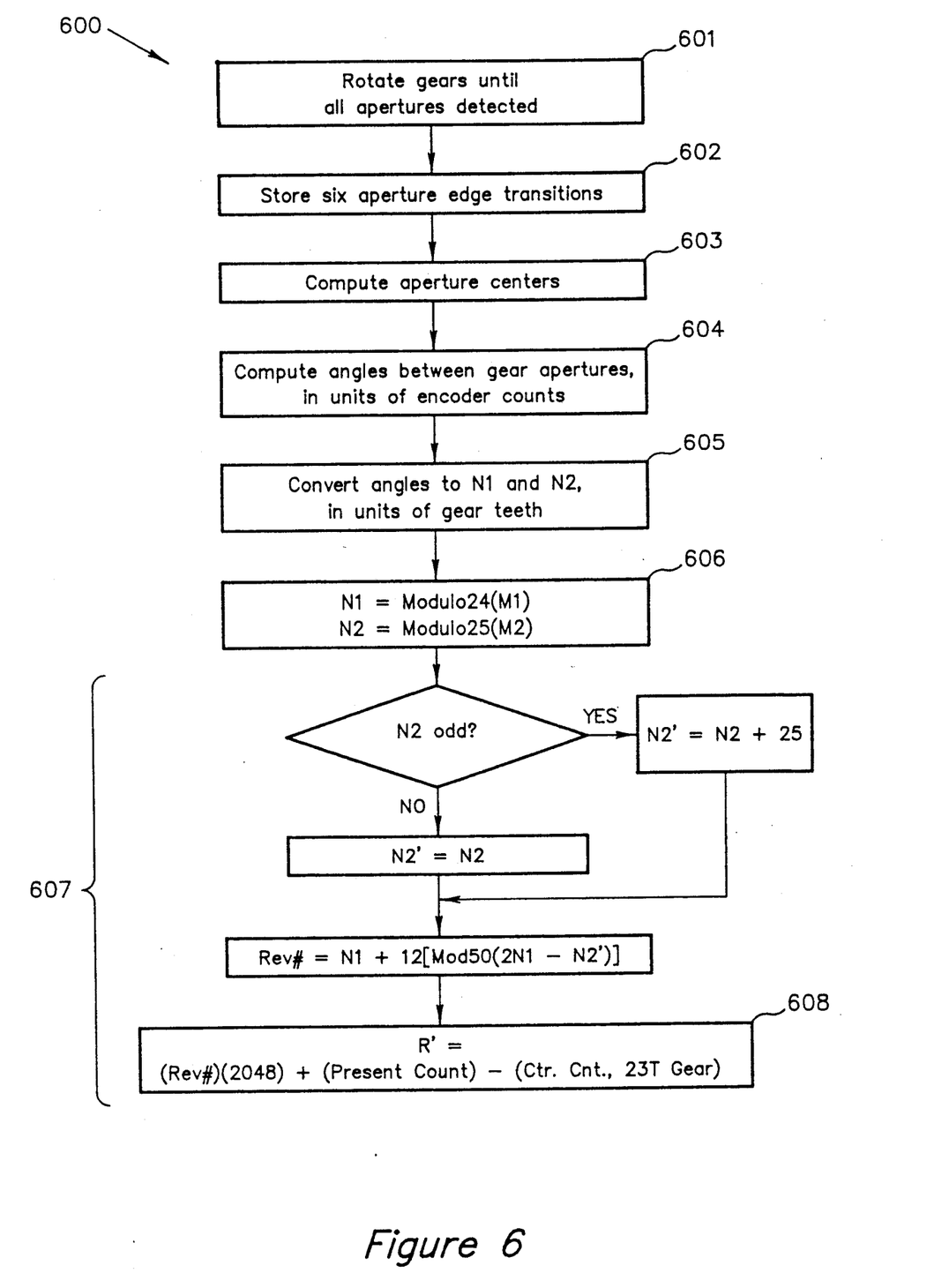
FIG. 6 is a flow chart of an alternative algorithm applicable to deriving positional representations for the position encoder of FIG. 1.

An alternative method 600, shown in FIG. 6, is similar to method 500, but it dispenses with step 504 in which encoder gear 130 is returned to its computed center after all three index marks have been located. Instead, the displacement of encoder gear 130 from its computed sensor is accounted for in an additional and final step 608. Step 601 is essentially the same as step 501 in that the leading and trailing edge positions for each index aperture are determined. Step 602 differs from step 502 in that the stop position at which motor 110 is stopped after all six aperture edges are sensed is not changed during the remainder of the initialization procedure.

As is step 503, step 603 requires the computation of the aperture centers from the edge position data. As indicated above, the need for the repositioning of step 504 is dispensed with in method 600. Steps 604–607 correspond to steps 505–508 of method 500. Step 508 mathematically adds in the partial revolution performed physically in step 504 of method 500.

To express the partial revolutions conveniently, the final rotational position R' is expressed in units of code wheel quadrature states rather than revolutions. Specifically:

$$R' = R(2048) + \text{stop position} - \text{first index center position.}$$

The product of R and 2048 is the expression of a number of whole revolutions in units of quadrature states. The amount added to this product represents the fractional revolution that would have been required to restore gear 130 to its alignment position. R' does not correspond to an integral number of revolutions except in the case where step 601 ends with index aperture 136 in alignment with sensor 142. R' can assume a value from 0 through 1,228,799 so that 1,228,800 rotational positions can be resolved using the 2048 resolvable orientations of code wheel 122 in conjunction with the 600 resolvable revolutions of initialization section 114. Once R' is determined, changes in rotational position can be tracked by incremental encoder section 116 in a manner known in the art.

Figure 7:
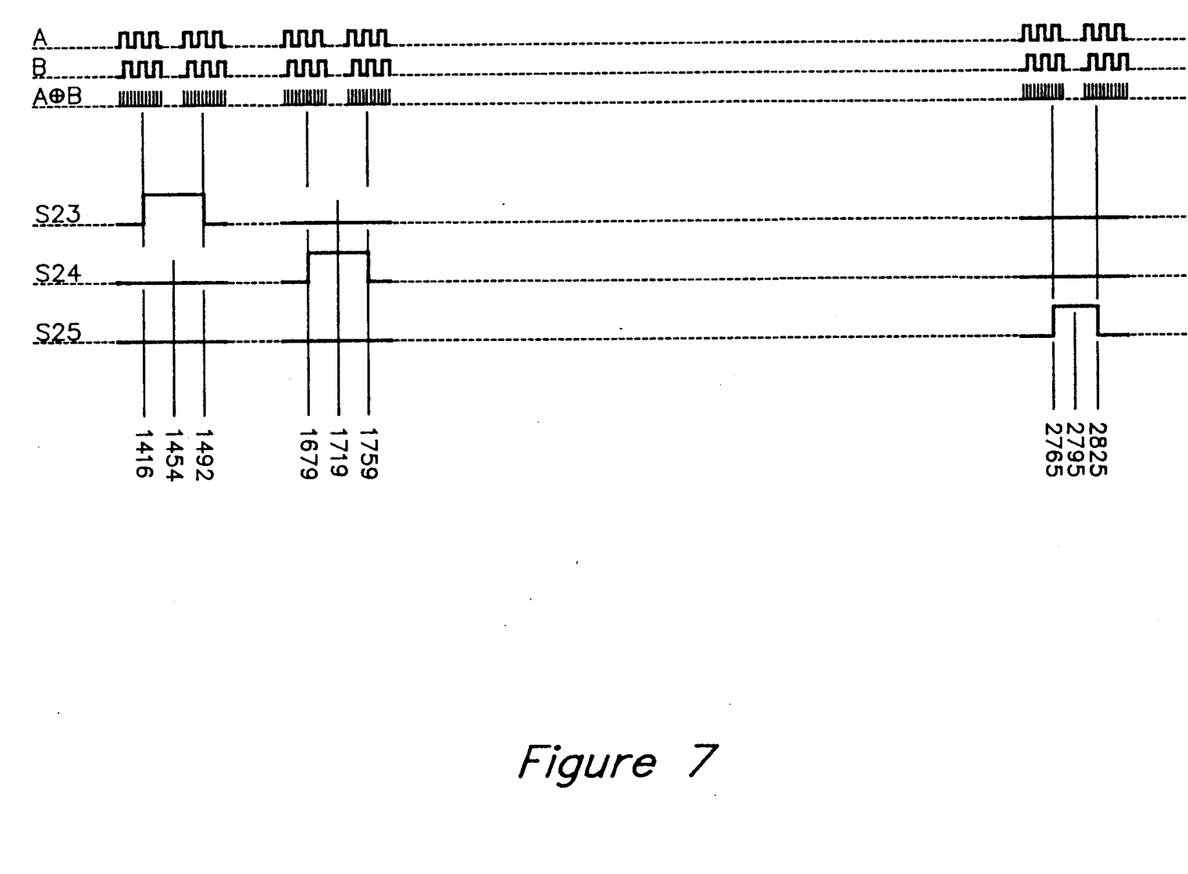
FIG. 7 is a timing diagram for signals generated by the position encoder of FIG. 1.

Methods 500 and 600 further explained with reference to the timing chart of FIG. 7. Signals A and B represent the quadrature readouts of incremental encoder section 116. Each of signal A and signal B generates 512 pulses per revolution of wheel 122, corresponding to the 512 tally marks 127. Signals A and B can be combined to form signal A ⊕ B, which distinguishes 2048 states per revolution of wheel 122. These states are used to compare the relative orientations of gears 130, 132 and 134.

Upon startup, shaft 108 is rotated, which causes wheel 122 and gears 128, 130, 132 and 134 to rotate. At state 1416, a leading edge of aperture 136 is aligned relative to sensor 142 sufficiently for light emitted by emitter 144 to be detected by detector 146. This detection produces an positive-going transition in detection signal S23 output by sensor 142. This is followed by a negative going transition at state 1492 as the trailing edge of aperture 136 passes sensor 142. The average of the state values determined at the transitions is 1454, which is treated as the center position of aperture 136. Likewise, a center position of 1719 is computed for aperture 138 based on edge detections at 1679 and 1759 shown on a signal S24, and a center position of 2795 is computed for aperture 140 based on edge detections at 2765 and 2825 shown on a signal 25.

The phase position of gear 132 relative to gear 130 is computed by substracting the respective center positions, e.g., $1719 - 1454 = 265$ states. Dividing the phase in states by the number of states per teeth one gets the phase position in teeth, e.g., $265 \div 89.04 \approx 2.97 \approx 3$. Thus, a comparison of S23 and S24 in FIG. 7 indicates that gear 132 lags gear 130 by 3 teeth. Similarly, gear 134 lags gear 130 by 1341 states or 15 teeth. This is the position of FIG. 3D, which as indicated earlier, corresponds to revolution number 195.

In method 500, motor 100 would be reversed to return to state 1454, where aperture 136 should be centered relative to sensor 142. The resulting state would be identified with whole revolution number 195 and subsequent motion would be tracked relative to this whole revolution number. In method 600, the initialization motion would stop at 2825 or a little above that. The stop count would be substracted to obtain an offset from a whole revolution. The initialization position would be determined by the revolution number and the offset. Note that the offset can be greater than one revolution since in some cases, more than one revolution of gear 130 is required to ensure detections of apertures 136 and 140.

Figure 8:
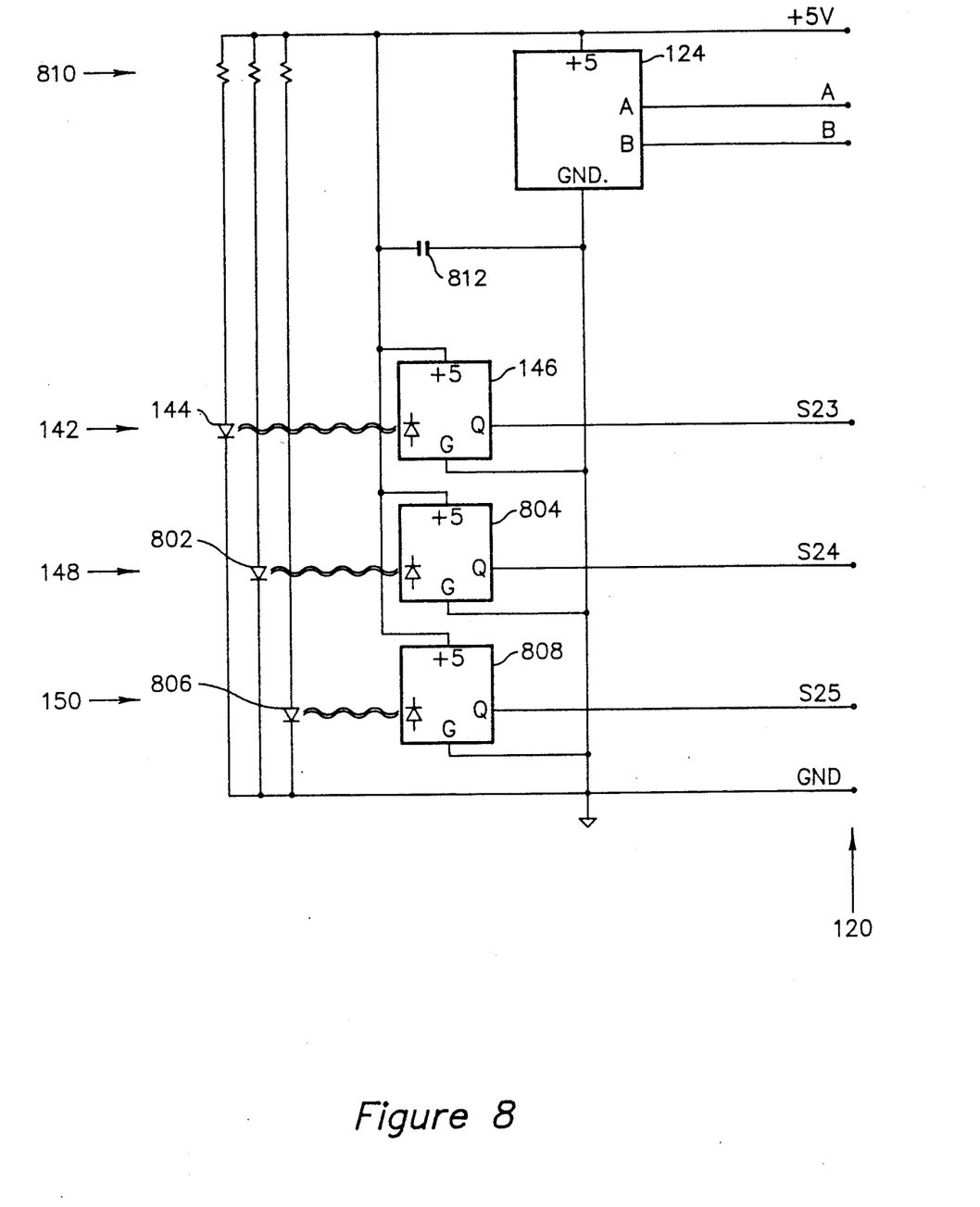
FIG. 8 is a schematic representing sensors and outputs thereof for the position encoder of FIG. 1.

The electronic components on circuit board 118 of FIG. 1 are illustrated schematically in FIG. 8. Sensor 142 includes emitter 144 and detector 146 which provides a detection signal S23. Sensor 148 includes an emitter 802 and a detector 804 which provides a detection signal S24. Sensor 150 includes an emitter 806 and a detector 808 which provides a detection signal S25. Emitters 144, 802 and 806 are light-emitting diode assemblies such as the TRW-type OP-240. They are powered off of five volts through 180Ω resistors 810. A power-supply 0.1 µF bypass capacitor is included to filter noise from the power supply. Detectors 146, 804 and 808 are opto-sensors such as the TRW OPL-550. Incremental sensor module 124 senses tally apertures on code wheel 122 and generates A and B quadrature signals. These quadrature signals, along with signals S23, S24 and S25, as well as power and ground, are routed to connector 120.

Figure 9:
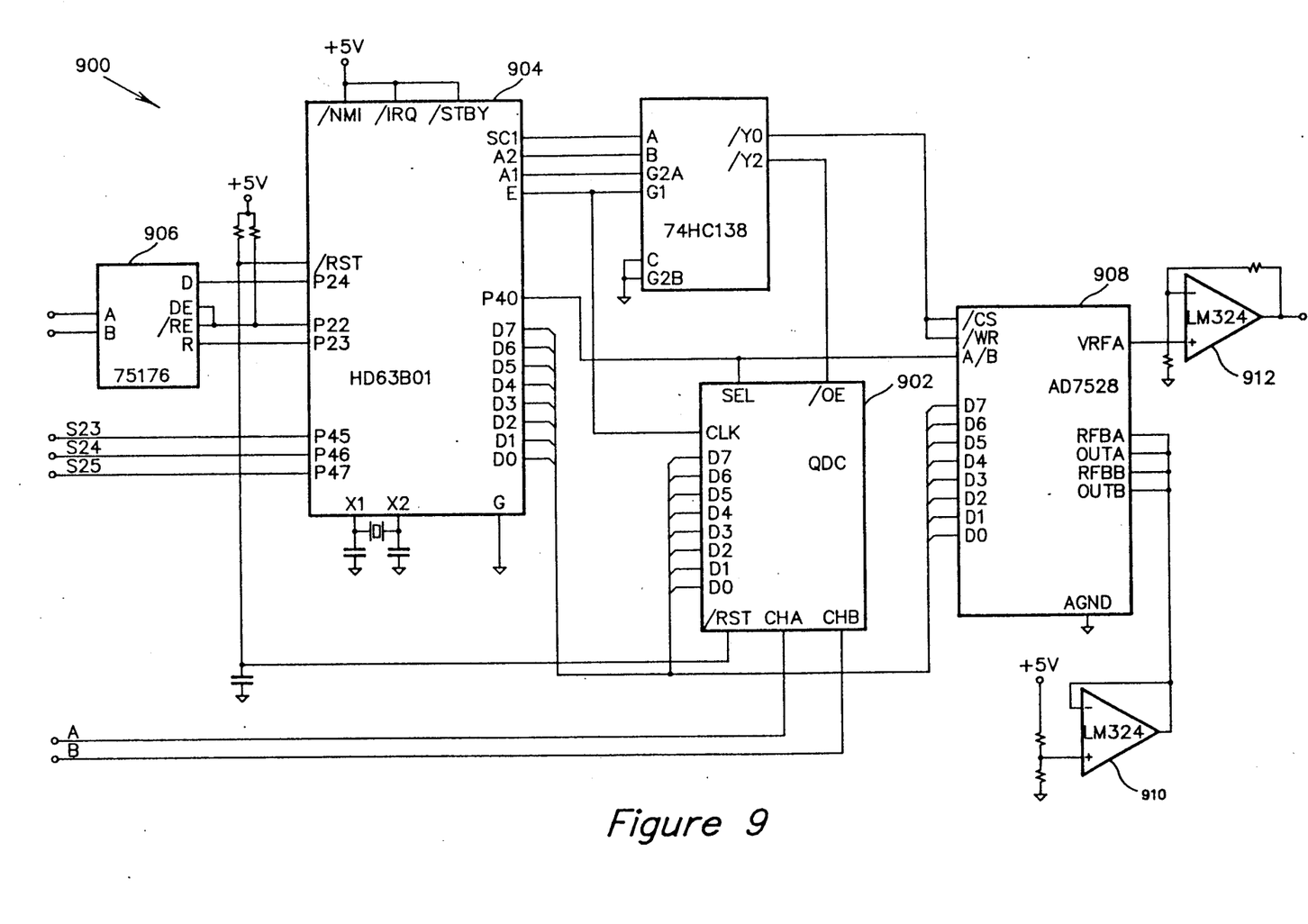
FIG. 9 is a schematic indicating the processing circuitry applied to derive positional representations from the outputs of the sensors of FIG. 8.

A cable from connector 120 connects to a motion control microcomputer 900, shown in FIG. 9. Microcomputer 900 is described only briefly, as such technology is well known in the art (see for example the books available from Galil Motion Control, authored by Jacob Tal). In such computers, the A and B quadrature signals are counted by a quadrature decoder and counter (QDC) integrated circuit 902, such as the Hewlett-Packard HCTL-2000. In addition, a microprocessor 904, such as the 63B01, is used to compare position commands sent to it, via bus receiver 906, to the actual positions read from QDC 902. The actual positions are iteratively substracted from the command positions by microprocessor 904. The resulting differences are used to calculate target velocity values, which are in turn used to generate a motor current demand value. The motor command value output from microprocessor 904 is converted to an analog signal by a digital-to-analog converter 908, which can be an Analog Devices AD7528 DAC. The resulting analog motor command signal is level shifted by operational amplifier 910, and amplified and buffered by operational amplifier 912. The output of microcomputer 900 is an analog current control signal fed to the drive electronics for motor 110. A standard address decoder 914, in this case a 74HC138, is used for selectively enabling QDC 902 and ADC 908.

The present invention provides for many alternatives to the embodiment described above. There is wide applicability to motion control systems involving different types and combinations of robotic devices. Manufacturing, medical, hazardous material handling and other applications are provided for. Unidirectional, bidirectional and multidirectional system can be implemented. While the preferred embodiment relies on quadrature decoded states, tally marks, whether apertures, reflective markings, or other marks, can be used directly. In a unidirectional system, directionality can be ignored; in a bi-directional system a means other than quadrature decoding can be used to determine direction. Phase positions can be measured in revolutions, degrees or other units. Other algorithms may be employed to determine phase position. Different numbers of gear teeth can be used. Other variations upon and modifications to the disclosed embodiments are provided by the present invention, the scope of which is limited only by the following claims.

What is claimed is:

1. A position encoder for measuring a multi-revolution rotational position of an object capable of multiple revolutions, said encoder comprising:
   incremental encoder means for resolving a number of orientation states of said object, said incremental encoder means including a wheel with a closed array of N tally marks and incremental sensor means for measuring changes in an orientation of said wheel by detecting a number of said tally marks passing a predetermined sensor position, said wheel being mechanically coupled to said object so that changes in orientation of said wheel are proportional to changes in orientation of said object;
   a first rotational element having T1 teeth and a first index mark, where $T1 < N/2$, said first rotational element being mechanically coupled to said object so that changes in an orientation thereof are proportional to changes in orientation of said object;
   a first sensor means for providing a first detection signal when said first index mark achieves a first predetermined orientation;
   a second rotational element having T2 teeth and a second index mark, where $T2 \neq T1$, said second rotational element being mechanically coupled to said object so that changes in an orientation thereof are proportional to changes in orientation of said object;
   a second sensor means for providing a second detection signal when said second index mark achieves a second predetermined orientation; and
   measurement means for determining relative orientations of said first and second rotational elements, said measurement means being coupled to said first sensor means, said second sensor means and said incremental encoder means, said measurement means providing said determination as a function of the number of said tally marks detected between a time said object is oriented so that said first index mark is detected and a time said object is oriented so that said second index mark is detected.

2. A method of locally initializing an incremental encoder, said encoder including:
   incremental encoder means for resolving a number of orientation states of said object, said incremental encoder means including a wheel with a closed array of N tally marks and incremental sensor means for measuring changes in an orientation of said wheel by detecting a number of said tally marks passing a predetermined sensor position, said wheel being mechanically coupled to said object so that changes in orientation of said wheel are proportional to changes in orientation of said object;
   a first rotational element having T1 teeth and a first index mark, where $T1 < N/2$, said first rotational element being mechanically coupled to said object so that changes in an orientation thereof are proportional to changes in orientation of said object;
   a first sensor means for providing a first detection signal when said first index mark achieves a first predetermined orientation;
   a second rotational element having T2 teeth and a second index mark, where $T2 \neq T1$, said second rotational element being mechanically coupled to said object so that changes in its orientation are proportional to changes in orientation of said object;
   a second sensor means for providing a second detection signal when said second index mark achieves a second predetermined orientation; and
   measurement means determining relative orientations of said first and second rotational elements, said measurement means being coupled to said first sensor means, said second sensor means and said incremental encoder means, said measurement means providing said determination as a function of the number of said tally marks detected between time said object is oriented so that said first index mark is detected and a time said object is oriented so that said second index mark is detected,
   said method comprising the steps of:
   a) turning said rotational elements until both of said first and second index marks have been detected;
   b) determining a spatial phase relations between said first and second rotational elements as a function of the order in which said first and second index marks are detected and the number of tally marks detected between index mark detections; and
   c) calculating an absolute position based on the spatial phase relationships so determined.

3. The method of claim 2 where step b further comprises turning said rotational elements until said first index mark is centered on said first sensor means, whereby said absolute position corresponds with an integral number of revolutions from a predetermined origin.

4. A position encoder for measuring a multi-revolution rotational position of an object capable of multiple revolutions, said encoder comprising:

incremental encoder means for resolving a number of orientation states of said object, said incremental encoder including a wheel with a closed array of tally marks and incremental sensor means for measuring changes in an orientation of said wheel by detecting a number of said tally marks passing a predetermined sensor position, said wheel being mechanically coupled to said object so that changes in orientatin of said wheel proportional to changes in orientation of said object;

a drive gear rigidly and coaxially coupled to said wheel so as to change orientation in unison therewith, said drive gear having T1 teeth;

a first idler gear having T1 teeth and a first index mark, said first idler gear engaging said drive gear so as to change orientation concurrently with said first gear by an angle equal and opposite to an orientation change undergone by said drive gear;

a first sensor for providing a first detection signal when said first index mark achieves a first predetermined orientation position on said first idler gear;

a second idler gear having T2 teeth and a second index mark, where T2≠T1, said second idler gear engaging said first idler gear so as to change orientation concurrently with said first idler gear by an amount determined by a ratio T1/T2;

a second sensor for providing a second detection signal when said second index mark achieves a second predetermined orientational position on said second idler gear;

a third idler gear having T3 teeth and a third index mark, where T3≠T2 and where T3≠T1, said third idler gear engaging said first idler gear so as to change orientation concurrently with said first idler gear by an amount determined by a ratio T1/T3;

a third sensor for providing a third detection signal when said third index mark achieves a third predetermined orientational position on said third idler gear; and processor means for determining relative orientations of said first, second and third idler gears, said processor means being coupled to said first sensor means, said second sensor means, said third sensor means and said incremental encoder means, said processor means providing a relative position determination as a function of the number of said tally marks detected between a time said object is oriented so that said first index mark is detected and a time said object is oriented so that said second index mark is detected and as a function of the number of said tally marks detected between the time said object is oriented so that said first index mark is detected and a time said object is oriented so that said third index mark is detected; said processor means including means for calculating an absolute rotational position from said relative position determination.

5. An apparatus providing for local initialization of an incremental encoder, said incremental encoder including a wheel with a closed array of tally marks and incremental sensor means for measuring changes in an orientation of said wheel by detecting a number of said tally marks passing a predetermined sensor position, said wheel being mechanically coupled to an object so that changes in orientation of said wheel are proportional to changes in orientation of said object, said apparatus comprising:

a drive gear rigidly and coaxially coupled to said wheel to as so change orientation in unison therewith, said drive gear having T1 teeth;

a first idler gear having T1 teeth and a first index mark, said first idler gear engaging said drive gear so as to change orientation concurrently with said first idler gear through an angle equal and opposite to that undergone by said drive gear;

a first sensor for providing a first detection signal when said first index achieves a first predetermined orientational position on said first idler gear;

a second idler gear having T2 teeth and a second index mark, where T2≠T1, said second idler gear engaging said first idler gear so as to change orientation concurrently with said first idler gear by an amount determined by a ratio T1/T2;

a second sensor for providing a second detection signal when said second index mark achieves a second predetermined orientation position on said second idler gear;

a third idler gear having T3 teeth and a third index mark, where T3≠T1 and where T3≠T2, said third idler gear engaging said first idler gear so as to change orientation concurrently with said first idler gear by an amount determined by a ratio T1/T3;

a third sensor means for providing a third detection signal when said third idler gear achieves a third predetermined orientation, said third sensor means including means for detecting said third index mark when said third idler gear achieves said third predetermined orientation;

measurement means for determining relative orientations of said first, second and third idler gears, said measurement means being coupled to said first sensor means, said second sensor means, said third sensor means and said incremental encoder means, said measurement means providing said determination as a function of the number of said tally marks detected between a time said object is oriented so that said first index mark is detected and a time said object is oriented so that said second index mark is detected and as a function of the number of said tally marks detected between the time said object is oriented so that said first index mark is detected and a time said object is oriented so that said third index mark is detected; and processor means coupled to said measurement means for calculating an absolute rotational position from said determination.

6. A method of locally initializing an incremental encoder using an initialization apparatus said incremental encoder including:

a wheel with a closed array of tally marks and incremental sensor means for measuring changes in an orientation of said wheel by detecting a number of said tally marks passing a predetermined sensor position, said wheel being mechanically coupled to an object so that changes in orientation of said wheel are proportional to changes in orientation of said object, said apparatus including:

a drive gear rigidly and coaxially coupled to said wheel so as to change orientaton in unison therewith, said drive gear having T1 teeth;

a first idler gear having T1 teeth and a first index mark, said first idler gear engaging said drive gear so as to change orientation concurrently with said first gear through an angle equal and opposite to that undergone by said drive gear;

a first sensor for providing a first detection signal when said first index achieves a first predetermined orientational position on said first idler gear;

a second idler gear having T2 teeth and a second index mark, where $T2 \neq T1$, said second idler gear engaging said first idler gear so as to change orientation concurrently with said first gear by an amount determined by a ratio $T1/T2$;

a second sensor for providing a second detection signal when said second index mark achieves a second predetermined orientational position on said second idler gear;

a third idler gear having T3 teeth and a third index mark, where $T3 \neq T1$ and where $T3 \neq T2$, said third idler gear engaging said first gear so as to change orientation concurrently with said first gear by an amount determined by a ratio $T1/T3$;

a third sensor means for providing a third detection signal when said third gear achieves a third predetermined orientation, said third sensor means including means for detecting said third index mark when said third gear achieves said third predetermined orientation;

measurement means for determining relative orientations of said first, second and third gears, said measurement means being coupled to said first sensor means, said second sensor means, said third sensor means and said incremental encoder means, said measurement means providing said determination as a function of the number of said tally marks detected between a time said object is oriented so that said first index mark is detected and the time said object is oriented so that said second index mark is detected and as a function of the number of said tally marks detected between the time said object is oriented so that said first index mark is detected and a time said object is oriented so that said third index mark is detected; and processor means coupled to said measurement means for calculating an absolute rotational position from said determination, said method comprising the steps of:
a) turning said gears until all three index marks have been detected;
b) determining a spatial phase relations between said idler gears as a function of the order in which the index marks are detected and the number of tally marks detected between index mark detections; and
c) calculating an absolute position based on the spatial phase relationships so determined.

7. The method of claim 6 where step b further comprises turning said gears until said first index mark is centered on said first sensor means, whereby said absolute position corresponds with an integral number of revolutions from a predetermined origin.

* * * * *